United States Patent [19]

Nagy et al.

[11] Patent Number: 4,511,846

[45] Date of Patent: Apr. 16, 1985

[54] DESKEWING TIME-CRITICAL SIGNALS IN AUTOMATIC TEST EQUIPMENT

[75] Inventors: Alex Nagy; Dick Herlein, both of San Jose, Calif.

[73] Assignee: Fairchild Camera and Instrument Corporation, San Jose, Calif.

[21] Appl. No.: 381,617

[22] Filed: May 24, 1982

[51] Int. Cl.³ .............................................. H03K 5/06
[52] U.S. Cl. ................................... 328/164; 328/163; 328/58; 307/265; 307/268
[58] Field of Search ................ 328/58, 164, 163, 162; 307/265, 268, 247 R

[56] References Cited

U.S. PATENT DOCUMENTS

| | | | |
|---|---|---|---|
| 3,514,706 | 5/1970 | Dupraz et al. | 328/164 |
| 3,727,144 | 4/1973 | Senoo | 328/164 |
| 4,075,569 | 2/1978 | Wright | 328/164 |
| 4,141,033 | 2/1979 | de Boer | 328/164 |
| 4,280,224 | 7/1981 | Chethik | 328/164 |

Primary Examiner—John S. Heyman
Attorney, Agent, or Firm—Theodore S. Park; Robert C. Colwell

[57] ABSTRACT

Apparatus is provided for supplying deskewed signals. The apparatus includes a timing generator (20) for generating a pulse of desired duration, a deskew unit (17) connected to receive a pulse and adjust its width to compensate for previous errors, a differentiation network (15) for dividing the pulse into a leading and trailing edge signal, a plurality of logic gates (80 through 85) for receiving the pair of signals and supplying one of the pair along a set path and the other of the pair along a reset path, a deskew unit (86 and 89) associated with each path for delaying the signals thereon, and a latch (53) coupled to the deskew units to reform the electrical signal. Logic gates (80 through 85) operate under control of a format selector (90).

8 Claims, 6 Drawing Figures

DESKEWING TIME-CRITICAL SIGNALS IN AUTOMATIC TEST EQUIPMENT

BACKGROUND OF THE INVENTION

1. Field of the Invention

This invention relates to automatic test equipment of the type used to test integrated circuits either singly or in combination with other circuits, and in particular, to a technique for deskewing signals supplied to a device being tested in such a system.

2. Description of the Prior Art

Numerous types of automated test equipment for the testing of individual integrated circuits or groups of integrated circuits are known. For example, the Fairchild Test Systems Division of Fairchild Camera & Instrument Corporation, assignee of this invention, manufactures systems known as Sentry ® test systems. In such a system an individual integrated circuit is positioned in a suitable fixture to permit application of stimuli signals to various pins of the device, and reception of the resulting output signals from the device. By comparing the resulting output signals with those known to be produced by a satisfactory device, or expected by circuit analysis and calculations or other analytical techniques, the functionality and/or performance of the device being tested may be determined. Typically in such systems, a digital computer is used to control a timing module which supplies a variety of timing signals to a format control. The format control, in response to the timing module, generates signals of appropriate waveform and supplies them to a series of pin electronic circuits, each associated with a pin of the device under test. Signals from the device under test are returned to the pin electronic circuits and to a failure response unit for detecting the functionality and/or performance of the device being tested.

As increasing numbers of functions are placed on single integrated circuits or groups of integrated circuits, and as the performance of such circuits improves, the performance of the test system itself must be improved to enable it to detect variations in the performance of the integrated circuit being tested. One well-known problem in the manufacture and use of automatic test equipment is the timing skew of both the input signals supplied to the device under test, and the output signals received from the device under test. If the stimulation signals are not deskewed, the proper functioning and/or performance of the device being tested cannot be determined. In typical prior art systems, deskewing was accomplished using extensive manual adjustments of potentiometers associated with each pin of the automatic test equipment. In one prior art 120 pin system, each pin has 8 potentiometers associated with it for deskewing various signals supplied to, or received from, that pin. Thus, almost 1,000 potentiometers had to be manually adjusted in order to suitably align the system to perform tests. Because the settings of the particular potentiometers affected each other, it was often necessary to adjust each potentiometer more than once during alignment of the system. Obviously this was a lengthy, labor intensive, and expensive operation.

Another problem in prior art test systems is the generation and deskewing of inverted waveforms. In some modes of operation of automatic test equipment it is desirable to supply first one waveform, and then its complement, to the device under test. As explained above it is desirable that both such signals be deskewed.

Furthermore, with the operational speed of individual test systems approaching 20 megaHertz, skew tolerances of no more than +1 nanosecond maximum and +500 picoseconds typical are necessary. Using conventional prior art techniques, tolerances to within one nanosecond have been achieved, but only if tests are conducted immediately after alignment of the test system and only using small subsets of the system's timing and format capabilities. As the system is continuously used, the reliability of the alignment diminishes. Consequently, when a test engineer determines that yields of the devices being tested are varying, he does not know whether there is indeed a yield variation, or whether the test equipment has deviated from specifications.

SUMMARY OF THE INVENTION

This invention eliminates the manual adjustment of potentiometers necessary with prior art test apparatus. The invention enables adjusting system skew over all formats and timing generators to within tolerances not heretofore achievable. Furthermore, by eliminating the extensive manual adjustments necessary, the invention shortens "down time" for system alignment from about a half day to approximately 15 minutes. The shorter alignment time enables the system to be more frequently aligned resulting in increased reliability of test results.

In one embodiment apparatus for supplying deskewed signals comprises: generating means for generating an electrical signal of desired duration, the signal including a leading edge and a trailing edge; differentiation means coupled to the generating means for separating the electrical signal into a pair of signals, one of the pair being a leading edge signal and the other a trailing edge signal; logic gate means connected to receive the pair of signals and supply one of the pair along a set path and the other of the pair along a reset path; set and reset time delay means, each connected to the corresponding path to delay the signal thereon by a desired time; latch means connected to the set and reset time delay means to receive signals therefrom and reform the electrical signal of desired duration; and control means coupled to the logic gate means for controlling to which of the set and reset paths each of the pair of signals is supplied.

In the preferred embodiment the set and reset time delay means comprise apparatus for delaying an electrical signal present at a selected node and include a first multiplexing means for connecting one of a plurality n of input terminals to an output terminal, a plurality of adjustable length delay lines, each coupled between a different set of input terminals to thereby cause the electrical signal to be supplied to each input terminal after the first input terminal after passing through at least one delay line, and means for supplying the signal to be delayed to the first input terminal.

DETAILED DESCRIPTION OF THE PREFERRED EMBODIMENTS

Figure 1:
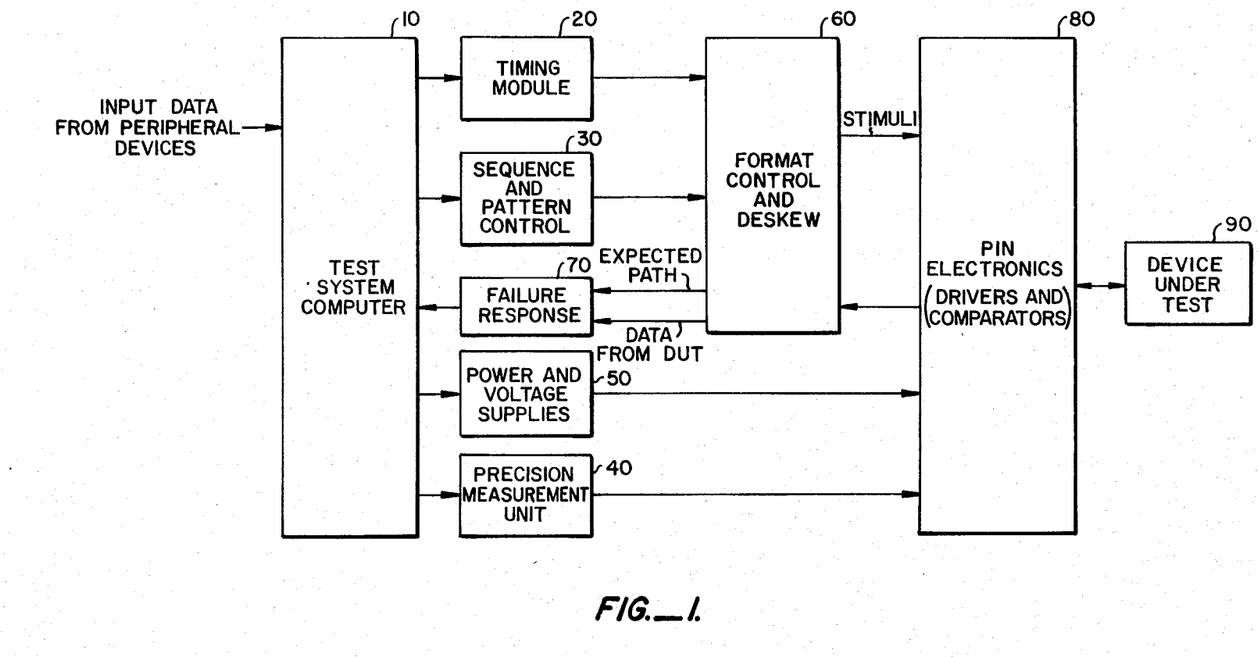
FIG. 1 is a system block diagram of a typical test system illustrating the interrelationship of the timing module, the format control circuits, and the pin electronics circuits.

FIG. 1 is a block diagram of a typical test system illustrating one use of our invention. As shown in FIG. 1 the test system includes a test system computer 10 which transmits control information and receives subsystem status reports, interrupt requests and test data from the device under test 90. In general various registers within the computer 10 allow control of each pin of the device under test 90, while other portions of the test system computer 10 compare outputs from the device under test 90 with a stored expected output pattern. The overall operation of the test system will be determined by a stored program in the test system computer 10.

The test system computer 10 will control a timing module 20 which allows the user of the test system to relatively accurately place edges of various timing signals supplied to the device under test. In a typical embodiment timing module 20 will contain 16 timing generators which position 32 independent timing edges. Thus the device under test 90 may be tested with various timing conditions to emulate combinations of input signals to which the device under test would be subjected in its intended application. The sequence and pattern control 30 allows the creation of various sequences and patterns of input data to be supplied to the device under test 90 to measure and/or detect its performance in response to such sequences or patterns. A precision measurement unit 40 allows quantitative voltage and current measurements at individual pins of the device under test 90, and allows forcing specified voltages or currents on desired pins of the device under test 90. Power and voltage supplies 50 are necessary for the operation of the device under test 90. The timing signals and desired sequence and patterns are combined and deskewed in the format control and deskew circuit 60, and then sent to the pin electronics circuit 80 and the device under test 90. The resulting output signals from the device under test are compared to known voltages at the pin electronics circuit and output signals from that circuit are deskewed and their timing checked. The data are supplied to a failure response unit 70 and compared with the expected data. Incorrect output signals from the device under test cause the failure response unit 70 to interrupt the testing procedure being carried out by the test system computer 10.

In a typical test sequence a pulse from one of the timing generators within timing module 20 passes through the format control and deskew unit 60 and arrives at the device under test 90. A response from the device under test 90 comes back through the pin electronics circuit 80 to the deskew circuit and to the failure response unit 70, which tells the remainder of the test system whether the device under test 90 has passed or failed the test. In the preferred embodiment there will be a format control and deskew circuit 60, a failure reponse unit 70, and a pin electronics circuit 80 associated with each pin of the device under test 90.

In many integrated circuits the pins of the device are designed to be simultaneously stimulated. Thus, if a pulse is sent from the timing module 20, for example, to all of the address pins of a circuit, it is desirable that all of the signals arrive at the device under test as simultaneously as possible. Because there are many timing generators, and many different modes of signals supplied to various pins, the signals which arrive at the device under test 90 may arrive through numerous different possible paths, resulting in substantial variations in propagation delay for the pulses. The format control and deskew circuit discussed in conjunction with FIGS. 2, 3, and 4 enable the signals directed to the various pins of the device under test to arrive there at the same time within design tolerances. Furthermore, these circuits allow automatic adjustment of the time delay applied by the deskewing circuit. In addition other deskewing circuits 35 and 36 allow deskewing of the output data from the device under test 90 so that the output data and the expected data from the format control and deskew unit 60 arrive at the failure response unit 70 at the same time within design tolerances. Furthermore, since the timing generators and deskew elements are independently adjustable, the deskew elements are equally usable for maintaining a precise time difference between different pins of the device under test. Thus, if the different pins of the device under test are both input pins driven by different timing generators, the timing generators can be set to the same value and the deskew circuits can be set to appropriately determine values such that the timed signals arrive simultaneously at the different pins of the device under test. Later, if one or both timing generators is set to a different value, the timing difference between the two pins will be determined by the timing difference between the two generators rather than by the differences in the circuitry used to couple the different timing generators to the different pins of the device under test. Similarly, if the different pins of the device under test are both output pins. Similarly, if the different pins of the device under test are a combination of input pins and output pins and pins which could be input pins at one time and output pins at another time.

Figure 2:
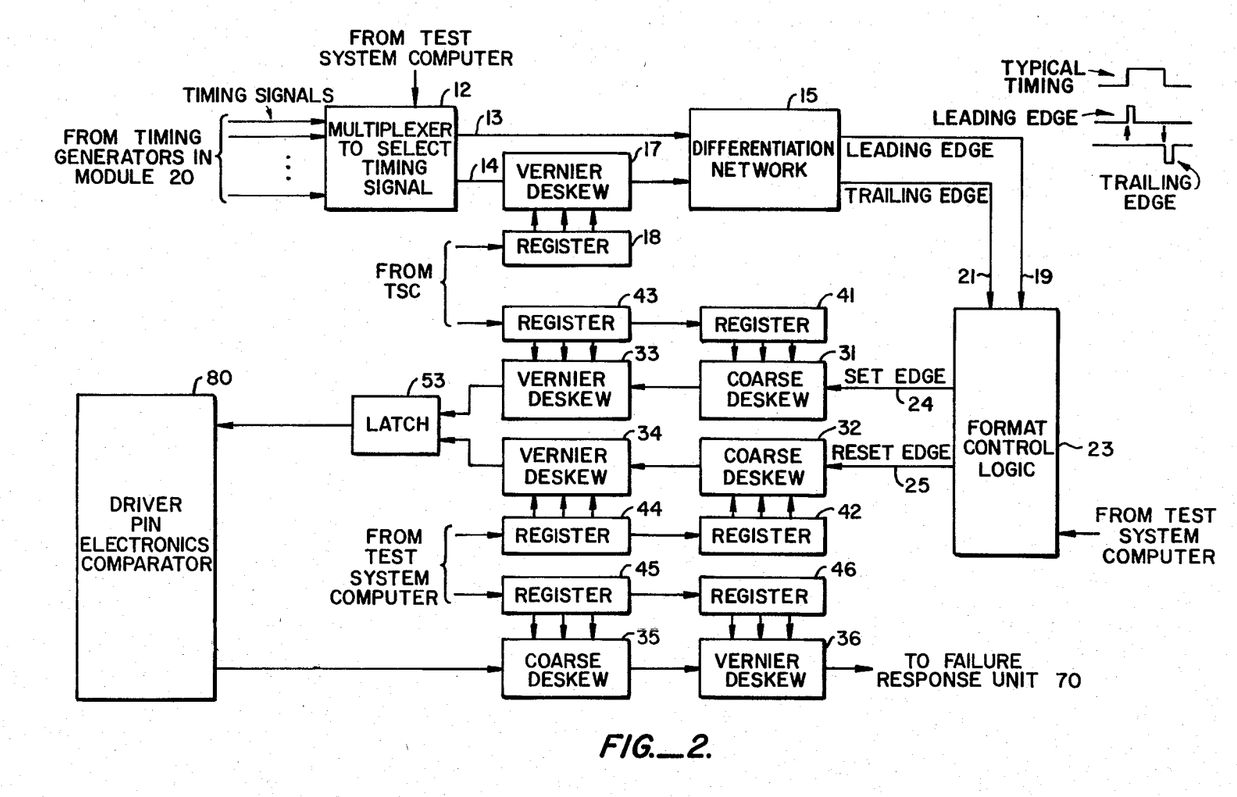
FIG. 2 is a more detailed schematic of the format control circuit associated with each pin of the device under test.

FIG. 2 is a more detailed block diagram of the format control and deskew circuit 60. As shown a group of timing signals supplied by the timing generators present in timing module 20 are supplied over a plurality of lines to a well known multiplexer 12. Control signals from the test system computer 10 are also supplied to multiplexer 12 to thereby select one of the timing signals from the timing generators. The particular timing signal selected will depend upon the test to be performed on the device under test. The selected timing signal is then supplied from multiplexer 12 to differentiation network 15 over a pair of lines 13 and 14. A vernier deskew unit 17, operating under control of register 18, which in turn is controlled by the test system computer, maintains the desired pulse width of the timing signal supplied to differentiation network 15. The operation of vernier deskew unit 17 and register 18 is the same as the operation of the other vernier deskew units shown in FIG. 2, and will be explained below.

Using well-known techniques, differentiation network 15 extracts from the timing signal a leading edge signal and a trailing edge signal. The leading edge signal on line 19 and the trailing edge signal on line 21 are supplied to format control logic 23. A typical timing signal is shown near lines 19 and 21, together with the leading edge and trailing edge signals extracted by differentiation network 15 from the timing signal.

In general, a typical test signal to be created as a result of the format control logic 23 will include a train of pulses of different durations and characteristics designed to test a particular aspect of the integrated circuit being tested. The test signal supplied by format control logic 23 will be dependent upon the desired test to be performed by the user of the test apparatus. In general the format control logic 23 will be controlled by a stored program resident in the test system computer 10. The format control logic 23 translates the leading and trailing edge signals on lines 19 and 21 into set and reset signals which are supplied from the format control logic on lines 24 and 25. The set and reset signals will be appropriately chosen by format control logic 23 to cause latch 53 to switch in a desired manner to supply signals to the pin electronics circuit 80. In general either of the leading edge or the trailing edge signal may be used to set or reset latch 53 dependent upon the test program desired.

The set and reset signals supplied on lines 24 and 25 are each supplied to a coarse deskew unit 31 and 32, respectively, and to vernier deskew units 33 and 34, respectively. The coarse and vernier deskew units function to impose a desired time delay on the set and reset signals before they are supplied to the pin electronics 80. As discussed above, in testing integrated circuits it is desirable to simultaneously impose the test signals on various pins of the integrated circuit. Because of the different path delays inherent in the various paths by which signals may reach the integrated circuit being tested, some of the signals will need to be delayed more than other signals. The coarse and vernier deskew units shown in FIG. 2 will delay the signals passing through them by an amount specified by the test system computer controlling the registers associated with each deskew unit. For example, register 41, in response to data from the test system computer 10, will control the operation of coarse deskew unit 31 to impose the desired time delay on the set edge signal on line 24. The particular operation of the coarse and vernier deskew units shown in FIG. 2 will be explained in conjunction with FIGS. 3 and 4.

After appropriate deskewing, the set and reset signals are supplied to latch 53. Latch 53 functions to recombine the set and reset signals into a single pulse having the characteristics specified by the program in the test system computer. Latch 53 is used to supply the pulse to a driver in the pin electronics circuit 80. As discussed in conjunction with FIG. 1, this signal is imposed on a single pin of the integrated circuit being tested.

If the pin being tested is an output pin, rather than an input pin, signals from it are received by the comparator in pin electronics circuit 80. These signals are in turn supplied through coarse and vernier deskew units 35 and 36. These units function in the same manner as coarse and vernier deskew units 31-34, and are under control of registers 45 and 46. After deskewing, the output signals from the pin of the device under test 90 are supplied to a failure response unit 70 where they are compared with the expected output response.

Figure 3:
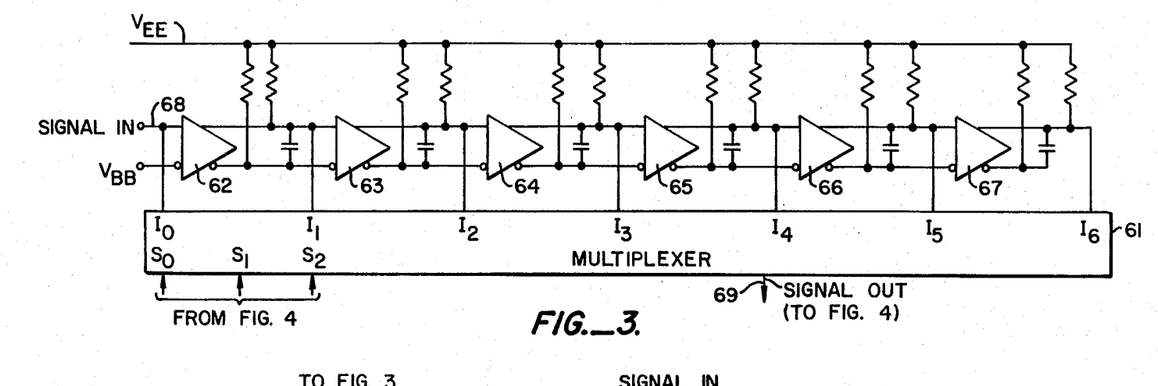
FIG. 3 is a detailed schematic of the coarse deskew circuit shown in FIG. 2.

FIG. 3 is a detailed schematic of any one of the coarse deskew units shown schematically in FIG. 2. The coarse deskew unit includes a multiplexer 61 and a plurality of logic gates 62-67. The logic gates are serially connected to receive sequentially the input signal supplied on node 68, designated "signal in." The other terminal of logic gate 62 is connected to a power supply $V_{BB}$, although it could also be connected to the complementary signal to signal in. A well-known network of pull down resistors and delay and filter capacitors are also provided. The logic gate network shown is commerically available, and in the preferred embodiment comprises two ECL 10116 integrated circuits. The multiplexer 61 is also commerically available as ECL part 10164. In operation multiplexer 61 will connect one of inputs $I_0$ to $I_6$ to the line 69 designated "signal out" in FIG. 3. Which of inputs $I_0$ to $I_6$ will be connected to line 69 depends upon the three address bits $S_0$, $S_1$, and $S_2$ supplied to multiplexer 61. These three address bits are supplied from a register which is discussed in conjunction with FIG. 4. Of course, if desired, a separate register could be positioned in proximity to the circuit shown in FIG. 3. Accordingly, the signal on line 68 may be delayed by between 0 and 6 gate delays before being supplied as "signal out" on line 69. For example, if it is desired to impose a three gate delay between the node 68 and node 69, then input $I_3$ will be coupled to output line 69. Accordingly, the signal on line 68 will pass through each of logic gates 62, 63, and 64 before being supplied to line 69, thereby incurring a three gate delay in transmission. For the specified ECL parts each gate will delay the signal by approximately two nanoseconds, and accordingly the apparatus depicted in FIG. 3 will have a range of approximately 12 nanoseconds and a resolution of two nanoseconds.

Figure 4:
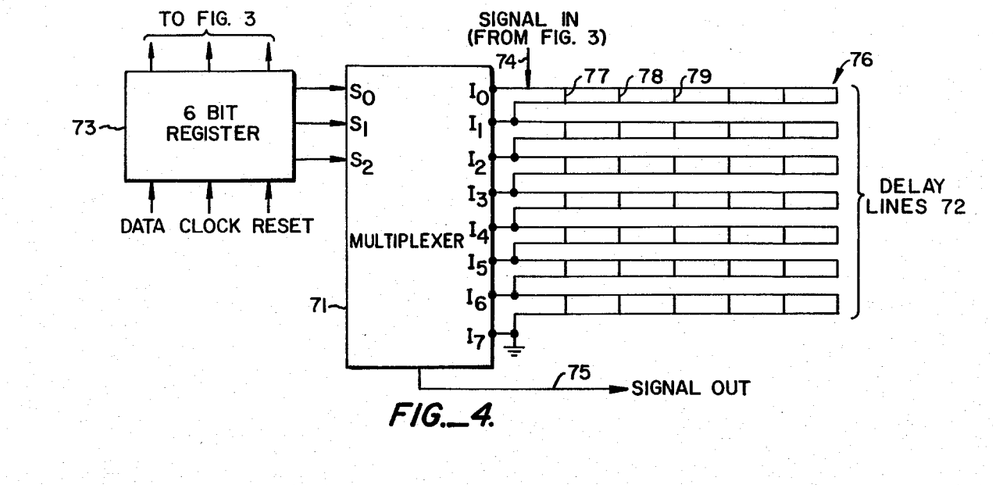
FIG. 4 is a detailed schematic of the vernier deskew circuit shown in FIG. 2.

FIG. 4 is a schematic diagram of any of the vernier deskew units used in FIG. 2. The vernier deskew unit includes a multiplexer 71 and a plurality of delay lines 72. One extended loop of each delay line 72 is connected between each pair of inputs $I_0$-$I_7$ of multiplexer 71. An input signal is supplied on line 74. Depending upon the state of the address bits $S_0$, $S_1$, and $S_2$, multiplexer 71 will connect one of inputs $I_0$-$I_7$ to the output line 75. As evident from FIG. 4, the choice of which input is connected to the multiplexer output 75 will determine the amount of the delay line through which the signal will pass between input terminal 74 and the output terminal 75. For example, if input $I_4$ is selected in response to the address bits $S_0$-$S_2$, then the signal supplied on line 74 will pass through all of the delay line between input $I_0$ and input $I_4$, and then will be switched onto output 75. In the preferred embodiment multiplexer 71 comprises an ECL 10164 multiplexer, and delay lines 72 comprise electrically conductive traces on the ceramic substrate upon which multiplexer 71 is mounted. Each delay line 76 includes a plurality of shorting bars such as 77 and 78 which may be used to change the length of the delay line. These shorting bars allow compensation for variations in the propagation delay of multiplexer 71. For the embodiment shown in FIG. 4 the electrical signal supplied on line 74 will flow through delay line 76 and shorting bar 77 back to input node $I_l$. For longer time delays, one or more shorting bars may be destroyed. For example, if a delay in propagation of the input signal between node $I_0$ and $I_1$ is desired corresponding to the time required for signals to flow through line 76, shorting bar 79, and back to node $I_1$, then shorting bars 77 and 78 may be destroyed. In the preferred embodiment the shorting bars also comprise electrically conductive traces on the ceramic substrate which traces may be destroyed using any desired technique, for example, by using a laser to vaporize the electrically conductive material. In another embodiment the delay line 72 will comprise electrically conductive regions on a printed circuit board. Fabricating the delay lines in either manner allows repair of improperly destroyed shorting bars using conductive epoxy.

As shown in FIGS. 2, 3, and 4 each multiplexer in either the coarse deskew unit or the vernier deskew unit is controlled by the state of a register associated therewith. A typical register 73 receives data signals, clock signals, and a reset signal, and in turn supplies a three bit address to multiplexer 61 and a three bit address to multiplexer 71. In the preferred embodiment the six bit register 73 comprises an ECL register 10186. Other well known registers may also be used.

In the preferred embodiment the ceramic substrate containing multiplexer 71 is connected to appropriate measurement equipment and the difference in propagation delay between the input terminals $I_0$ and $I_1$ is adjusted by destroying appropriate shorting bars to be 312 picoseconds, including any delay inherent within multiplexer 71 itself. This may be achieved in the manner described above by destruction of appropriate shorting bars in the first delay line 76. (If finer resolution is desired additional shorting bars may be utilized with closer spacings.) The length of the delay line between each subsequent pair of input terminals is also adjusted to create steps of 312 picoseconds. For example, the length of the delay line between terminals $I_4$ and $I_5$ is adjusted to cause the delay of the output signal on line 75 to be increased by 312 picoseconds if input $I_5$ is selected rather than input $I_4$. In this manner a range of 2,184 picoseconds is achieved with a resolution of 312 picoseconds. The vernier control of FIG. 4, together with the coarse control of FIG. 3, provide an overall range of 14.18 nanoseconds and a resolution of 312 picoseconds.

To calibrate the overall system described in FIG. 2 a particular timing signal is selected and arbitrary settings of the coarse and vernier delay circuits are made. The timing signal is transmitted through the format control and deskew logic 60 to the pin electronic circuit 80, and back. Using the test system itself the time delay of the signal is measured. The coarse and vernier deskew units are then adjusted to achieve the desired time delay for that particular timing signal so all signals will arrive at the pin electronics output simultaneously. The necessary address information for all registers is then stored, for example, on magnetic tape, magnetic disc, or using other known means. The next timing signal is selected and the process is repeated. This calibration is performed for each timing signal and for each format supplied by format control logic 23, and all data is similarly stored. Then, at the time of testing of a device, the particular data is retrieved from storage and supplied to the appropriate registers to create the necessary time delays required in the various signal paths.

Figure 5:
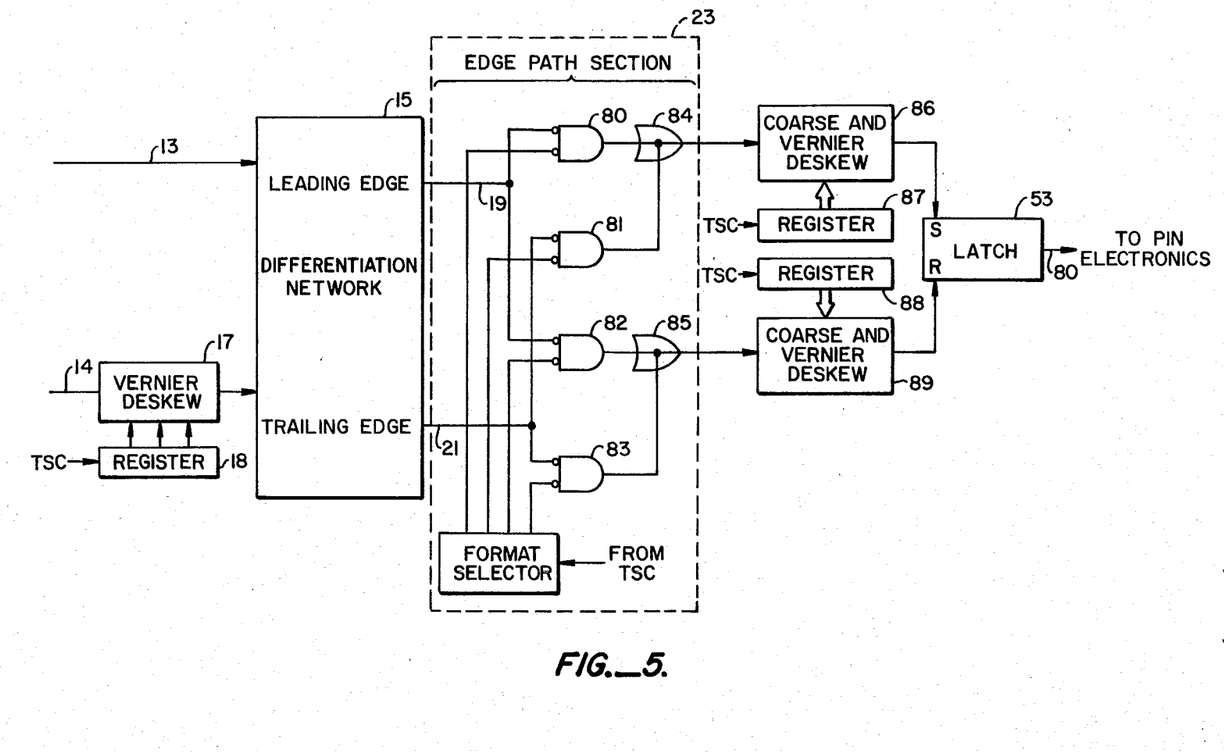
FIG. 5 is a more detailed schematic of the format control and deskew unit.

FIG. 5 is a schematic diagram illustrating the manner in which signals may be deskewed. The apparatus shown in FIG. 5 is particularly advantageous because it allows the signals to be deskewed during test system operation. Using the techniques of this invention, it is unnecessary to stop operation of the test system to supply an inverted waveform, even for the brief period which would be necessary to load new data into the registers associated with each coarse and vernier deskew unit. This enables substantially faster test system operation.

Figure 6:
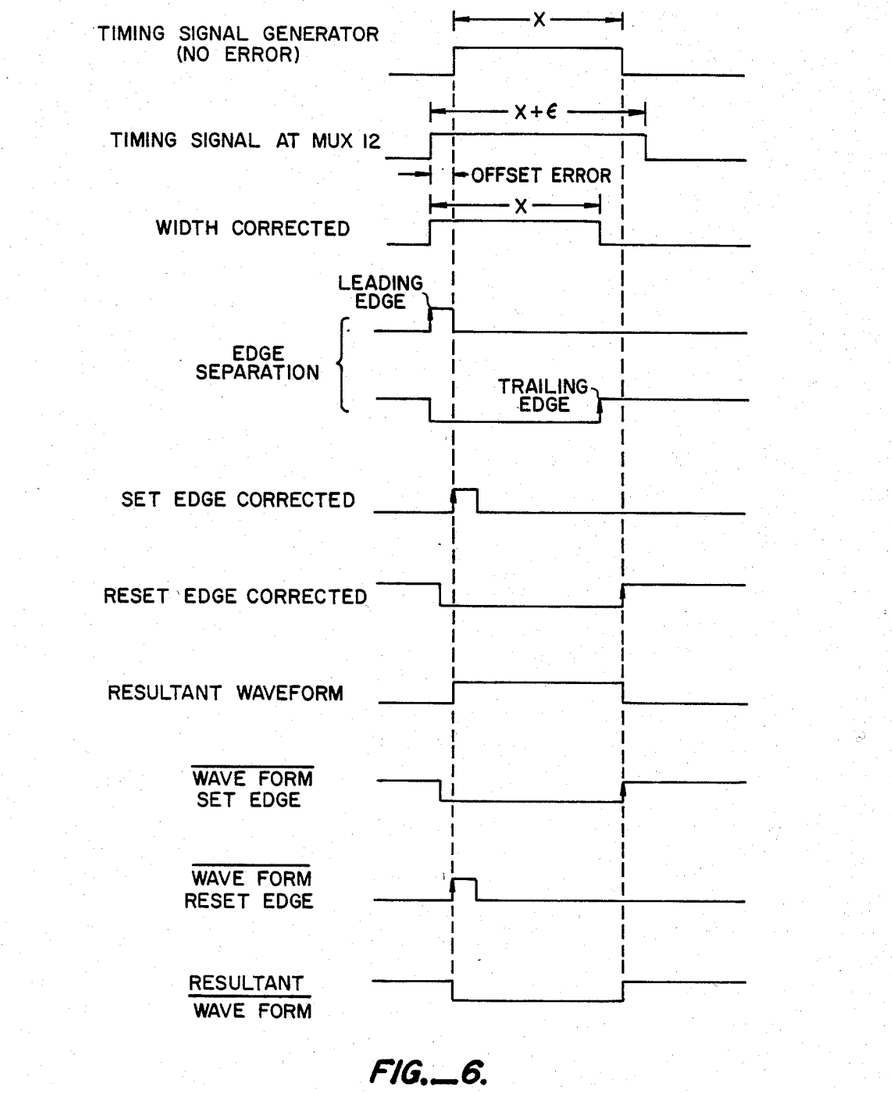
FIG. 6 is a timing diagram illustrating the function of the apparatus shown in FIG. 5.

The operation of the system for deskewing signals will be explained in conjunction with FIGS. 5 and 6. The timing signal from the timing generator 20 is supplied on lines 13 and 14 shown in FIG. 5. The uppermost signal designated "timing signal generator" in FIG. 6 shows the ideal pulse from the timing generator to have a width "X". By the time the signal from the timing generator has passed through multiplexer 12, however, a width error $\epsilon$ has been added to the pulse width X. This error is shown in the second signal in FIG. 6 designated "Timing Signal at Mux 12."

A first adjustment made to this timing signal is to correct its width. This correction is achieved by the vernier deskew unit 17 under control of the register 18, which in turn is controlled by the test system computer as explained above. If the width error $\epsilon$ is sufficiently large, or if a wider range of time delays are required, a coarse deskew unit like that depicted in FIG. 3 could be serially connected to the vernier deskew unit 17. After the width of the signal is corrected, an offset error may remain, as also shown in the signal designated "width corrected" in FIG. 6. As shown in FIG. 5 the width corrected signal is now supplied to differentiation network 15 where it is divided into leading and trailing edge signals which are supplied on lines 19 and 21, respectively. The leading and trailing edge signals are designated "edge separation" in FIG. 6.

FIG. 5 also shows format control logic 23 which includes a format selector 90, and a network of gates 80-85 to perform edge path selection. The leading edge signal on line 19 is supplied to gates 80 and 82, while the trailing edge signal on line 21 is supplied to gates 81 and 83. As also shown in FIG. 5, gates 80 and 81 are connected through a wired OR gate 84 to coarse and vernier deskew units 86, while gates 82 and 83 are coupled through wired OR gate 85 to coarse and vernier deskew units 89. Deskew unit 86 is coupled to a set terminal of latch 53, while deskew unit 89 is coupled to a reset terminal of latch 53.

Either of the leading or trailing edge signals may be supplied to either of the set or reset terminals of latch 53 by enabling appropriate gates 80 through 83. For example, if the leading edge signal is to be supplied to the reset terminal, then gate 82 will be enabled, and gate 80 disabled, by the format selector 90. Correspondingly, if the trailing edge signal on line 21 is to be supplied to the set terminal, then gate 81 will be enabled, and gate 83 disabled by format selector 90.

The coarse and vernier deskew unit designated 86 corresponds to the coarse and vernier deskew units 31 and 33 shown in FIG. 2, while the coarse and vernier deskew unit 89 corresponds to the coarse and vernier deskew units 32 and 34 shown in FIG. 2. Registers 87 correspond to registers 41 and 43, while registers 88 correspond to registers 42 and 44 in FIG. 2.

To supply deskewed inverted signals without stopping the test system operation to reload the registers 87 and 88, the format selector 90, typically a multiplexer or Hex D flip-flop 100151, causes the leading and trailing edge signals to pass through separate delay paths, and then, to provide an inverted waveform, causes the leading and trailing edge signals to pass through different delay paths. Because the signals take different paths, there will be slightly different timing delays associated with each signal. This error could be eliminated by reprogramming the contents of the registers 87 and 88 in the manner described above in conjunction with the discussion of calibration of the overall system. Because this procedure, although it occupies only milliseconds, consumes an undesirably long period of time when one is concerned with testing large numbers of circuits, a more efficient process is desirable. This techniques is described below.

The set and reset time delays introduced by deskew units 86 and 89 are set at their midpoints, as is the vernier deskew unit 17. A pulse of interest is set to the device under test and the time delay of the signal is measured. Using the vernier deskew unit 17 the pulse width is adjusted, as shown in conjunction with FIG. 6, until the pulse width is the desired value. As previously discussed, however, this results in an offset error. The set and reset deskew units 86 and 89 are then programmed to have the same time delay value, an amount sufficient to compensate for the offset error. In this manner the time delay associated with each of the set and reset paths is equal, so both the inverted and non-inverted waveforms have identical time delays when supplied to the device under test.

Although embodiments of the invention have been described above, these are intended to illustrate the invention rather than limit it. For example, in addition to applications involving electronic test equipment, the invention may be applied to other applications in which electrical signals are to be delayed or synchronized.

We claim:

1. Apparatus for supplying deskewed signals comprising:
   generating means for generating an electrical signal of desired duration, the signal including a leading edge and a trailing edge;
   differentiation means coupled to the generating means for separating the electrical signal into a pair of signals, one of the pair being a leading edge signal and the other a trailing edge signal;
   logic gate means connected to receive the pair of signals and to supply one of the pair of signals along a set path and the other of the pair of signals along a reset path;
   set and reset time delay means, each connected to the corresponding path to delay the leading edge signal and the trailing edge signal respectively by desired times;
   latch means connected to the set and reset time delay means to receive signals therefrom and form the electrical signal of desired duration;
   control means coupled to the logic gate means for controlling to which of the set and reset paths each of the pair of signals is supplied; and
   wherein the logic gate means includes a first pair of gates connected to receive the leading edge signal, and a second pair of gates connected to receive the trailing edge signal, one of each pair of gates being connected to the set time delay means, and the other of each pair to the reset time delay means.

2. Apparatus as in claim 1 wherein all of the gates are connected to the control means.

3. Apparatus as in claim 2 wherein each gate comprises a NOR gate.

4. Apparatus as in claim 3 wherein each of the set and reset time delay means delays the signals by the time required to compensate for the timing differences in the corresponding circuit paths.

5. Apparatus as in claim 1 wherein each of the set and reset time delay means comprises:
   first multiplexing means for connecting one of a plurality of into terminals of the first multiplexing means to an output terminal;
   a plurality of adjustable length delay lines each coupled between a different pair of input terminals to thereby cause the electrical signal to be supplied to each input terminal from a first input terminal after passing through at least one delay line; and
   means for supplying the signal to be delayed to the first input terminal.

6. Apparatus as in claim 5 wherein the means for supplying the signal to be delayed comprises:
   second multiplexing means for connecting one of a plurality of input nodes to a first input terminal;
   a plurality of gate delay means for delaying signals each coupled between a different pair of the input nodes to thereby cause the electrical signal to be supplied to each input node after the first input node after passing through at least one gate delay means; and
   means for coupling the selected node to the first input node.

7. Apparatus for supplying deskewed signals comprising:
   generating means for generating an electrical signal of desired duration, the signal including a leading edge and a trailing edge;
   differentiation means coupled to the generating means for separating the electrical signal into a pair of signals, one of the pair being a leading edge signal and the other a trailing edge signal;
   logic gate means connected to receive the pair of signals and supply one of the pair along a set path and the other of the pair along a reset path;
   set and reset time delay means, each connected to the corresponding path to delay the leading edge signal and the trailing edge signal respectively by desired times, and each including:
      first multiplexing means for connecting one of a plurality of input terminals of the first multiplexing means to an output terminal;
      a plurality of adjustable length delay lines each coupled between a different pair of input terminals to thereby cause the electrical signal to be supplied from a first input terminal to each input terminal after passing through at least one delay line;
      means for supplying the signal to be delayed to the first input terminal;
   latch means connected to the set and reset time delay means to receive signals therefrom and form the electrical signal of desired duration; and
   control means coupled to the logic gate means for controlling to which of the set and reset paths each of the pair of signals is supplied.

8. Apparatus as in claim 7 wherein the logic gate means comprises:
   a first pair of gates connected to receive the leading edge signal;
   a second pair of gates connected to receive the trailing edge signal; and wherein
      one of each pair is connected to the set time delay means, and the other of each pair to the reset time delay means.

* * * * *